United States Patent
Nakamura

(10) Patent No.: US 8,276,567 B2
(45) Date of Patent: Oct. 2, 2012

(54) MULTI-LAYER PIEZOELECTRIC ELEMENT, AND INJECTION APPARATUS AND FUEL INJECTION SYSTEM THAT EMPLOY THE SAME

(75) Inventor: Shigenobu Nakamura, Kirishima (JP)

(73) Assignee: Kyocera Corporation, Kyoto (JP)

( * ) Notice: Subject to any disclaimer, the term of this patent is extended or adjusted under 35 U.S.C. 154(b) by 110 days.

(21) Appl. No.: 12/810,785

(22) PCT Filed: Dec. 26, 2008

(86) PCT No.: PCT/JP2008/073789
§ 371 (c)(1),
(2), (4) Date: Sep. 3, 2010

(87) PCT Pub. No.: WO2009/082006
PCT Pub. Date: Jul. 2, 2009

(65) Prior Publication Data
US 2010/0326405 A1    Dec. 30, 2010

(30) Foreign Application Priority Data
Dec. 26, 2007   (JP) ................. 2007-334042

(51) Int. Cl.
F02M 51/00    (2006.01)
(52) U.S. Cl. .................. 123/494; 123/498; 310/364
(58) Field of Classification Search .................. 123/472, 123/490, 494, 498, 456; 310/363–366; 239/102.2
See application file for complete search history.

(56) References Cited

U.S. PATENT DOCUMENTS

| | | | | |
|---|---|---|---|---|
| 5,196,757 A * | 3/1993 | Omatsu | | 310/358 |
| 5,237,239 A * | 8/1993 | Inoue et al. | | 310/328 |
| 5,266,862 A * | 11/1993 | Ohya | | 310/328 |
| 6,208,026 B1 | 3/2001 | Bindig et al. | | |
| 6,507,140 B1 * | 1/2003 | Heinz et al. | | 310/366 |
| 6,522,052 B2 * | 2/2003 | Kihara et al. | | 310/366 |
| 6,700,306 B2 * | 3/2004 | Nakamura et al. | | 310/328 |
| 6,731,050 B2 * | 5/2004 | Bindig et al. | | 310/366 |
| 6,798,123 B2 * | 9/2004 | Bindig et al. | | 310/364 |
| 7,385,337 B2 * | 6/2008 | Mochizuki et al. | | 310/365 |
| 7,439,655 B2 * | 10/2008 | Asano et al. | | 310/328 |
| 7,449,077 B2 * | 11/2008 | Heinzmann et al. | | 156/89.12 |
| 7,509,716 B2 * | 3/2009 | Omura et al. | | 29/25.35 |
| 7,538,475 B2 * | 5/2009 | Ohmori et al. | | 310/328 |
| 7,633,210 B2 * | 12/2009 | Ono et al. | | 310/328 |
| 7,745,981 B2 * | 6/2010 | Omura et al. | | 310/366 |
| 7,777,398 B2 * | 8/2010 | Takei et al. | | 310/365 |
| 7,969,066 B2 * | 6/2011 | Kasai et al. | | 310/328 |

(Continued)

FOREIGN PATENT DOCUMENTS
JP    10-229227    8/1998
(Continued)

Primary Examiner — Hai Huynh
(74) Attorney, Agent, or Firm — DLA Piper LLP (US)

(57) ABSTRACT

To provide a multi-layer piezoelectric element that is improved to mitigate the decrease in the amount of displacement under such harsh operating conditions, the multi-layer piezoelectric element, the multi-layer piezoelectric element comprising: a stacked body comprising a plurality of piezoelectric material layers and a plurality of internal electrodes, the stacked body being formed by stacking the plurality of internal electrodes and the piezoelectric layers alternately on each other; and an external electrode formed on a side face of the stacked body, wherein the external electrode comprises a base portion and a first protrusion protruding from the base portion toward an outside.

13 Claims, 10 Drawing Sheets

U.S. PATENT DOCUMENTS

| | | | |
|---|---|---|---|
| 2001/0026114 A1* | 10/2001 | Takao et al. | 310/364 |
| 2002/0043901 A1 | 4/2002 | Kihara et al. | |
| 2005/0120528 A1 | 6/2005 | Okuda et al. | |
| 2005/0280336 A1 | 12/2005 | Mochizuki et al. | |
| 2006/0238073 A1 | 10/2006 | Ragossnig et al. | |
| 2007/0164638 A1* | 7/2007 | Kadotani et al. | 310/363 |

FOREIGN PATENT DOCUMENTS

| | | |
|---|---|---|
| JP | 2002-261339 | 9/2002 |
| JP | 2005-174974 | 6/2005 |
| JP | 2006-303319 | 11/2006 |
| WO | 2004/077583 | 9/2004 |

* cited by examiner

MULTI-LAYER PIEZOELECTRIC ELEMENT, AND INJECTION APPARATUS AND FUEL INJECTION SYSTEM THAT EMPLOY THE SAME

CROSS REFERENCE TO RELATED APPLICATION

This application is a national stage of international application No. PCT/JP2008/073789 filed on Dec. 26, 2008, which also claims priority to and the benefit of Japanese Patent Application No. 2007-334042 filed Dec. 26, 2007, the entire content of which are incorporated herein by reference.

TECHNICAL FIELD

The present invention relates to a multi-layer piezoelectric element (which may hereafter be referred to simply as element) used as a drive element (piezoelectric actuator), a sensor element or a circuit element. The drive element includes, for example, fuel injection apparatus of automobile engine, liquid injection apparatus of ink jet printer or the like, precision positioning device or vibration preventing device for an optical apparatus. The sensor element includes, for example, combustion pressure sensor, knocking sensor, acceleration sensor, load sensor, ultrasonic sensor, pressure sensor and yaw rate sensor. The circuit element includes, for example, piezoelectric gyro, piezoelectric switch, piezoelectric transducer and piezoelectric breaker.

BACKGROUND ART

External electrodes of the conventional multi-layer piezoelectric element have been formed from an electrically conductive paste having an electrically conductive material such as silver and glass, as disclosed in Patent Document 1. The external electrodes are formed by applying the electrically conductive paste onto side face of a stacked body and subjecting it to baking process.

There have been demands for a greater amount of displacement achieved under a higher pressure as efforts are made for size reduction of the multi-layer piezoelectric element. As a result, the multi-layer piezoelectric element is required to be operable under harsher conditions, namely continuous operation over a long period of time in the presence of higher electric field.

Patent Document 1: Japanese Patent Publication No. 2005-174974

DISCLOSURE OF THE INVENTION

Problems to be Solved by the Invention

However, the multi-layer piezoelectric element that uses the external electrodes disclosed in Patent Document 1 has such a problem that a part of the external electrode peels off the side face of the stacked body when used under harsh conditions such as high electric field, high pressure or continuous operation over a long period of time.

This is because, when energized, the element expands in the stacked direction and contracts in a direction perpendicular to the stacked direction. The expansion and contraction cause the stacked body to warp in the side face thereof, generating a stress in the bonding interface between the side face of the stacked body and the external electrode. This stress can cause the external electrode to warp, too, and peel off the side face of the stacked body. This may result in such a problem that a part of the internal electrodes is not energized and the amount of displacement of the multi-layer piezoelectric element decreases.

The present invention has been devised to solve the problems described above, and has an object of providing a multi-layer piezoelectric element that is improved to mitigate the decrease in the amount of displacement under such harsh operating conditions as described above.

Means for Solving the Problems

The multi-layer piezoelectric element of the present invention, in order to achieve the object described above, is constituted from a plurality of piezoelectric material layers and a plurality of internal electrodes, comprising a stacked body formed by stacking the piezoelectric material layers and the internal electrodes alternately one on another and an external electrode formed on a side face of the stacked body, wherein the external electrode comprises a base portion and a first protrusion protruding from the base portion toward an outside.

The injection apparatus of the present invention is constituted from one of the multi-layer piezoelectric elements described above and an injection orifice, wherein the injection orifice is configured to discharge a liquid by an operation of the multi-layer piezoelectric element.

Further, the fuel injection system of the present invention comprises a common rail configured to store a high-pressure fuel, the injection apparatus described above configured to eject the high-pressure fuel stored in the common rail, and an injection control system configured to send a drive signal to the injection apparatus.

EFFECTS OF THE INVENTION

According to the multi-layer piezoelectric element of the present invention, the external electrode is suppressed from warping since the external electrode has the first protrusion that protrudes toward the outside. As a result, the external electrodes are suppressed from peeling off of the stacked body. Thus since the internal electrodes can be stably energized, it is made possible to mitigate the decrease in the amount of displacement of the multi-layer piezoelectric element.

DESCRIPTION OF REFERENCE NUMERALS

Figure 1:
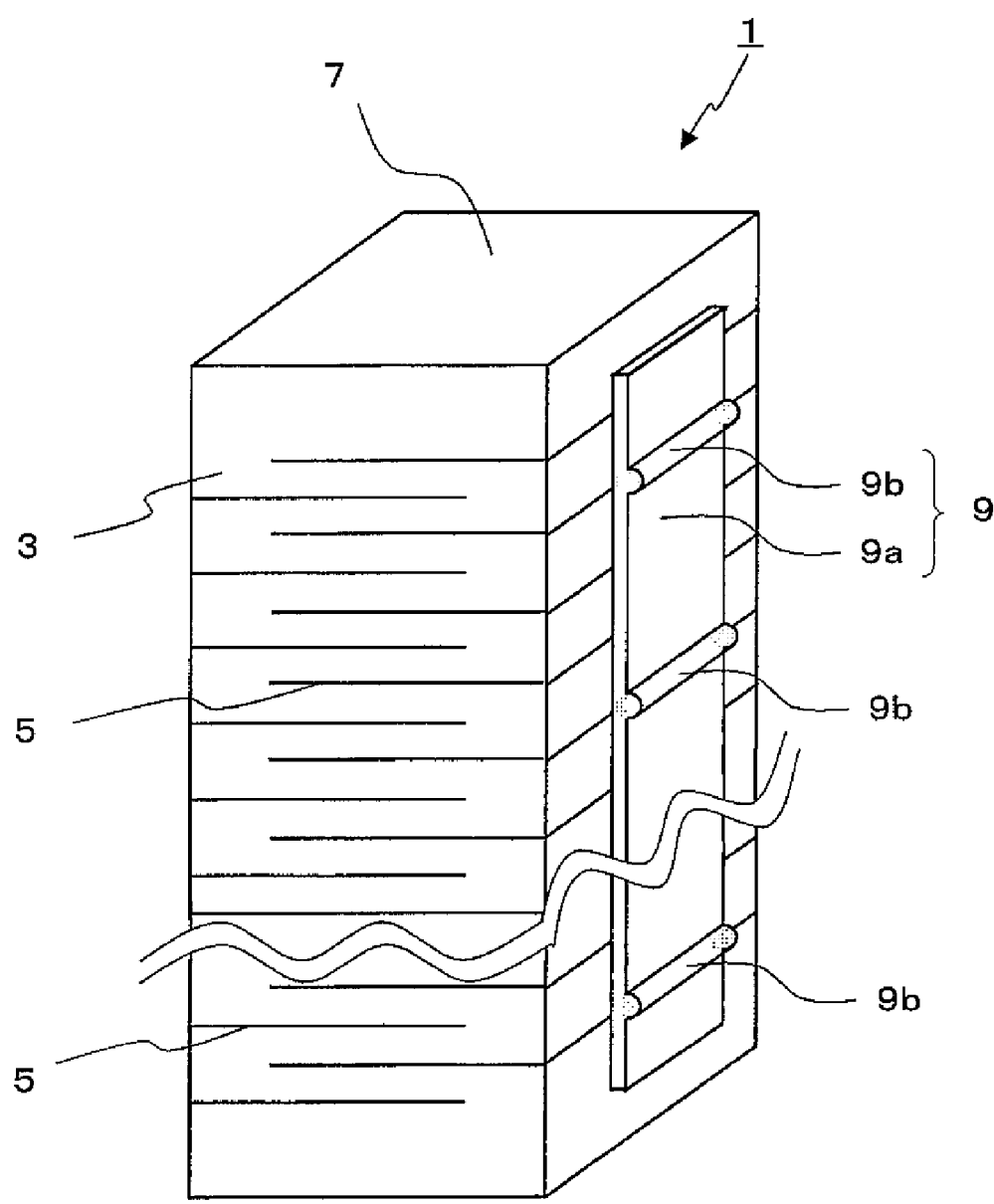
FIG. 1 is a perspective view showing a multi-layer piezoelectric element according to the first embodiment of the present invention.

1: Multi-layer piezoelectric element (element)
3: Piezoelectric material layer
5: Internal electrode
7: Stacked body
9: External electrode
9a: Base portion
9b: First protrusion
9c: Second protrusion
11: low-rigidity layer
13: Void
15: Metal portion
17: Ceramic portion
19: Injection apparatus
21: Injection orifice
23: Container
25: Needle valve
27: Fluid passage
29: Cylinder
31: Piston
33: Belleville spring
35: Fuel injection system
37: Common rail
39: Pump
41: Injection control unit
43: Fuel tank

BEST MODE FOR CARRYING OUT THE INVENTION

Now the multi-layer piezoelectric element of the present invention will be described in detail by making reference to the accompanying drawings.

Figure 2:
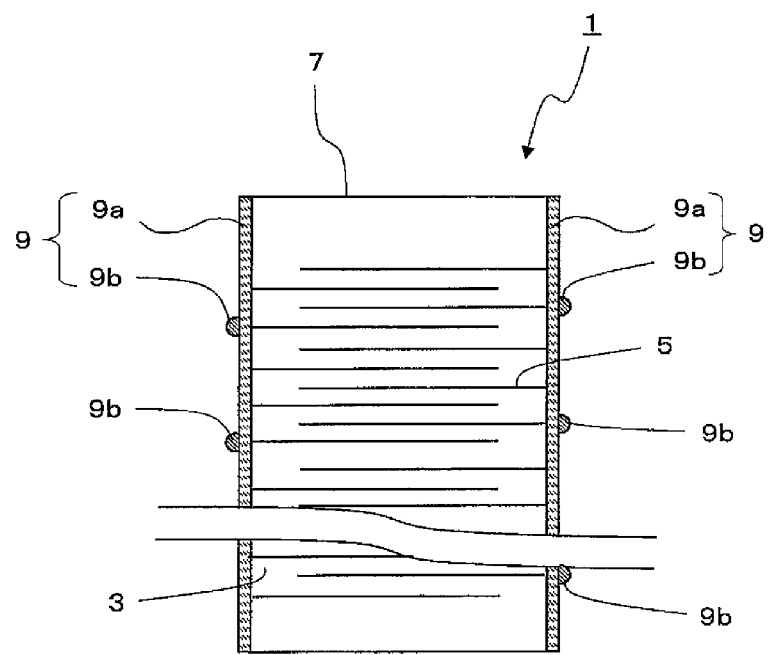
FIG. 2 is a sectional view parallel to the stacked direction of the multi-layer piezoelectric element according to the first embodiment.
Figure 3:
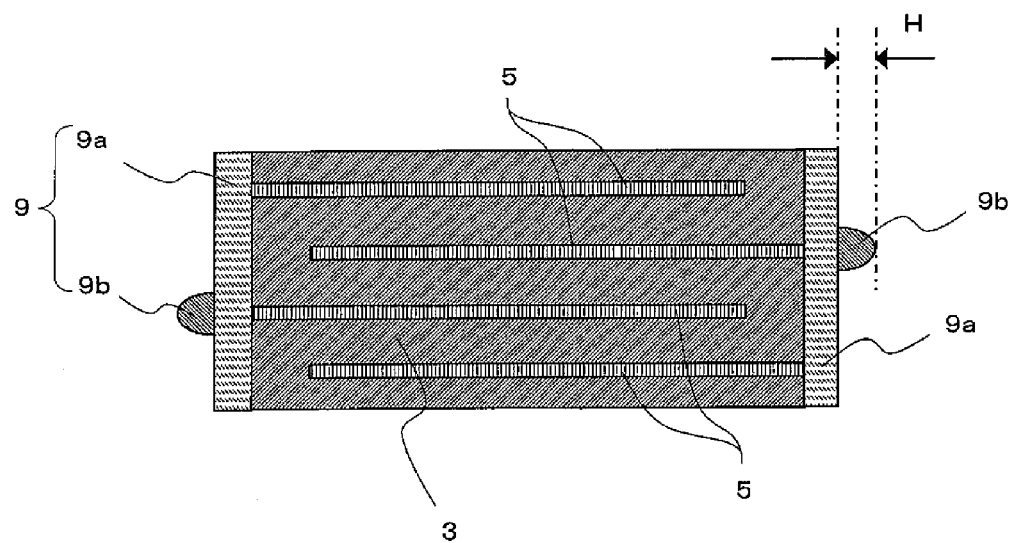
FIG. 3 is an enlarged sectional view of a portion where the first protrusion is provided in FIG. 2.

FIG. 1 is a perspective view showing a multi-layer piezoelectric element according to first embodiment of the present invention. FIG. 2 is a sectional view showing the element shown in FIG. 1 in a section parallel to the stacked direction. FIG. 3 is an enlarged sectional view showing the element shown in FIG. 2 in a portion thereof having the first protrusion.

As shown in FIG. 1 through FIG. 3, the element 1 according to the present embodiment comprises a plurality of piezoelectric material layers 3 and a plurality of internal electrodes 5, and comprises a stacked body 7 formed by stacking the piezoelectric material layers 3 and the internal electrodes 5 alternately one on another. External electrodes 9 are provided on two side faces of the stacked body 7 that oppose each other, and are electrically connected with the end of every other one of the internal electrodes 5 in a staggered manner. The external electrode 9 has a base portion 9a and a first protrusion 9b that protrudes from the base portion 9a toward the outside.

As the external electrode 9 has the first protrusion 9b as described above, the external electrode 9 is suppressed from warping for the following reason, thus suppressing the external electrode 9 from peeling off the stacked body 7. Specifically, such a stress is generated that causes the external electrode 9 to warp, since the side face of the element 1 warps when the element 1 is operated. However, the external electrode 9 has the first protrusion 9b that protrudes toward the outside so that the first protrusion 9b functions as a splint, and therefore a high repulsive force (resisting force) to the stress can be achieved. As a result, the stacked body 7 and the external electrodes 9 are suppressed from warping. Thus the external electrode 9 is suppressed from peeling off the stacked body 7.

It is preferable that height (size) H of the first protrusion 9b is 0.5 μm or more, as shown in FIG. 3. This improves the effect of the first protrusion 9b to function as a splint and decreases the warp of the external electrode 9. To improve the effect of the first protrusion 9b to function as a splint further, it is more preferable that height of the first protrusion 9b is 5 μm or more. In present embodiment, the height of the first protrusion 9b refers to the height of the apex of the first protrusion 9b from the surface of the base portion 9a as shown in FIG. 3. In case the surface of the base portion 9a that serves as the datum has surface irregularities (surface roughness), the center line of the surface roughness curve for the base portion is taken as the datum.

Herein, protrusions included in the surface irregularities due to the surface roughness and the first protrusion 9b can be clearly distinguished as follows.

Protrusions included in the surface irregularities due to the surface roughness are formed by protuberance of crystal grains that constitute the external electrode 9 and by the dissociation of crystal grains that constitute the external electrode 9 due to polishing of the surface of the external electrode 9 and heat treatment of the external electrode 9. As a result, size of the protrusion becomes substantially equal to the size of the crystal grains that constitute the external electrode 9. In contrast, the first protrusion 9b is formed by applying an electrically conductive paste to the surface of the base portion 9a, and therefore become far larger than the crystal grains that constitute the external electrode 9.

Therefore, protrusions included in the surface irregularities due to the surface roughness can be identified by observing the surface of the base portion 9a and the surface of the first protrusion 9b under a microscope. Thus, the first protrusion 9b and protrusions included in the surface irregularities due to the surface roughness can be easily distinguished.

While the external electrodes 9 are located on two side faces of the stacked body 7 that oppose each other as shown in FIG. 1, the external electrodes 9 may be provided on two adjacent side faces of the stacked body 7 or on the same side face.

Figure 4A:
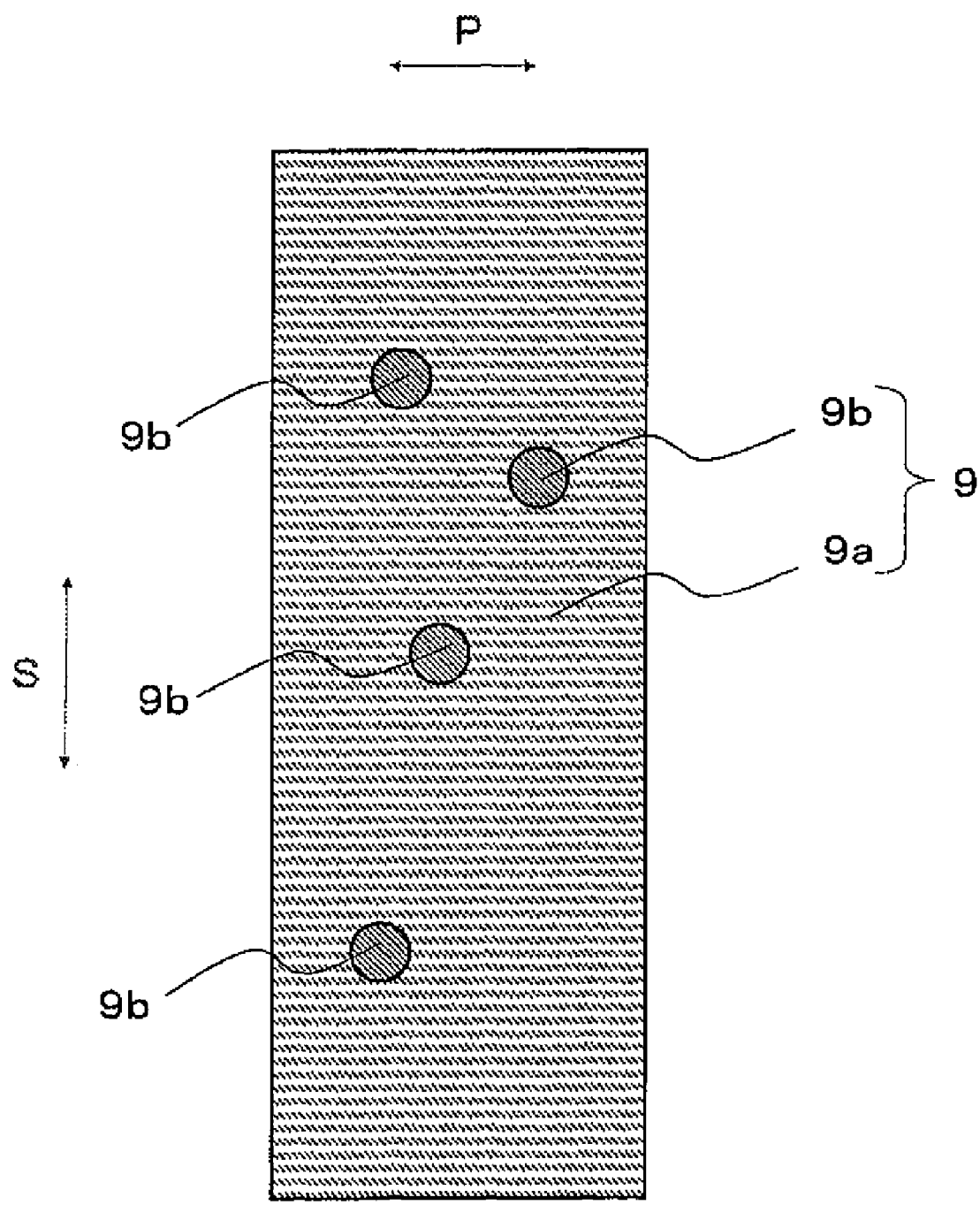
FIG. 4A is side view of a portion where the first protrusion is provided in the multi-layer piezoelectric element according to the second embodiment of the present invention.

Now second embodiment according to the present invention will be described. FIG. 4A is a side view of a portion where the first protrusion is provided in the multi-layer piezoelectric element according to the second embodiment.

In the second embodiment, the first protrusion 9b is formed in a semi-spherical shape of which width in a direction parallel to the stacked direction S is substantially equal to width in a direction P perpendicular to the stacked direction S, as shown in FIG. 4A. In case the border between the base portion 9a and the first protrusion 9b is curved when the element 1 is viewed sideways as shown in FIG. 4A, stress is suppressed from concentrating in a part of the border. As a result, stress can be distributed over a wide area.

Figure 4B:
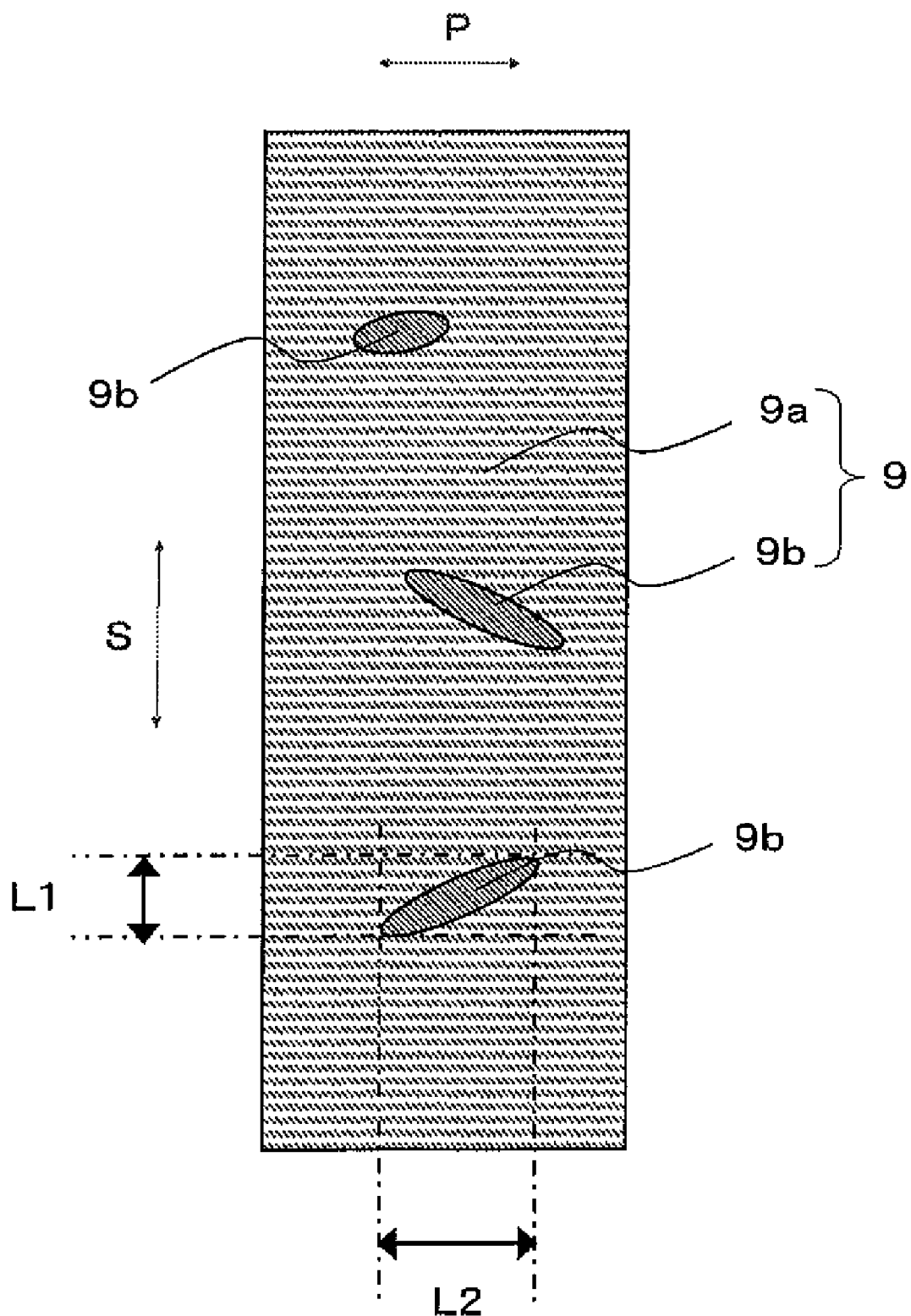
FIG. 4B is side view of a portion where the first protrusion is provided in the multi-layer piezoelectric element according to the third embodiment of the present invention.

Now third embodiment according to the present invention will be described. FIG. 4B is a side view of a portion where the first protrusion is provided in the multi-layer piezoelectric element according to the third embodiment.

It is preferable that the first protrusion 9b has such a configuration as the longitudinal length L1 thereof in the direction parallel to the stacked direction S is smaller than the lateral length L2 thereof in the direction P perpendicular to the stacked direction S, as shown in FIG. 4B. When bonding the base portion 9a of the external electrode 9 onto the stacked body 7 by baking, such a stress that causes warping in the direction perpendicular to the stacked direction S is generated in the external electrode 9 due to shrinkage. As a result, the effect of the first protrusion 9b to function as a splint can be improved further because the first protrusion 9b having the configuration described above is provided.

Herein, in the present specification, the longitudinal length L1 and the lateral length L2 are defined as follows.

The longitudinal length L1 is defined as the distance between two imaginary lines drawn so as to be perpendicular to the stacked direction S and tangential to the circumference of the first protrusion 9b on the surface of the base portion 9a of the external electrode 9.

The lateral length L2 is defined as the distance between two imaginary lines drawn so as to be parallel to the stacked direction S and tangential to the circumference of the first protrusion 9b on the surface of the base portion 9a of the external electrode 9. The surface of the base portion 9a of the external electrode 9 is a flat surface that is substantially parallel to the side face of the stacked body 7 whereon the external electrode 9 is formed.

Figure 4C:
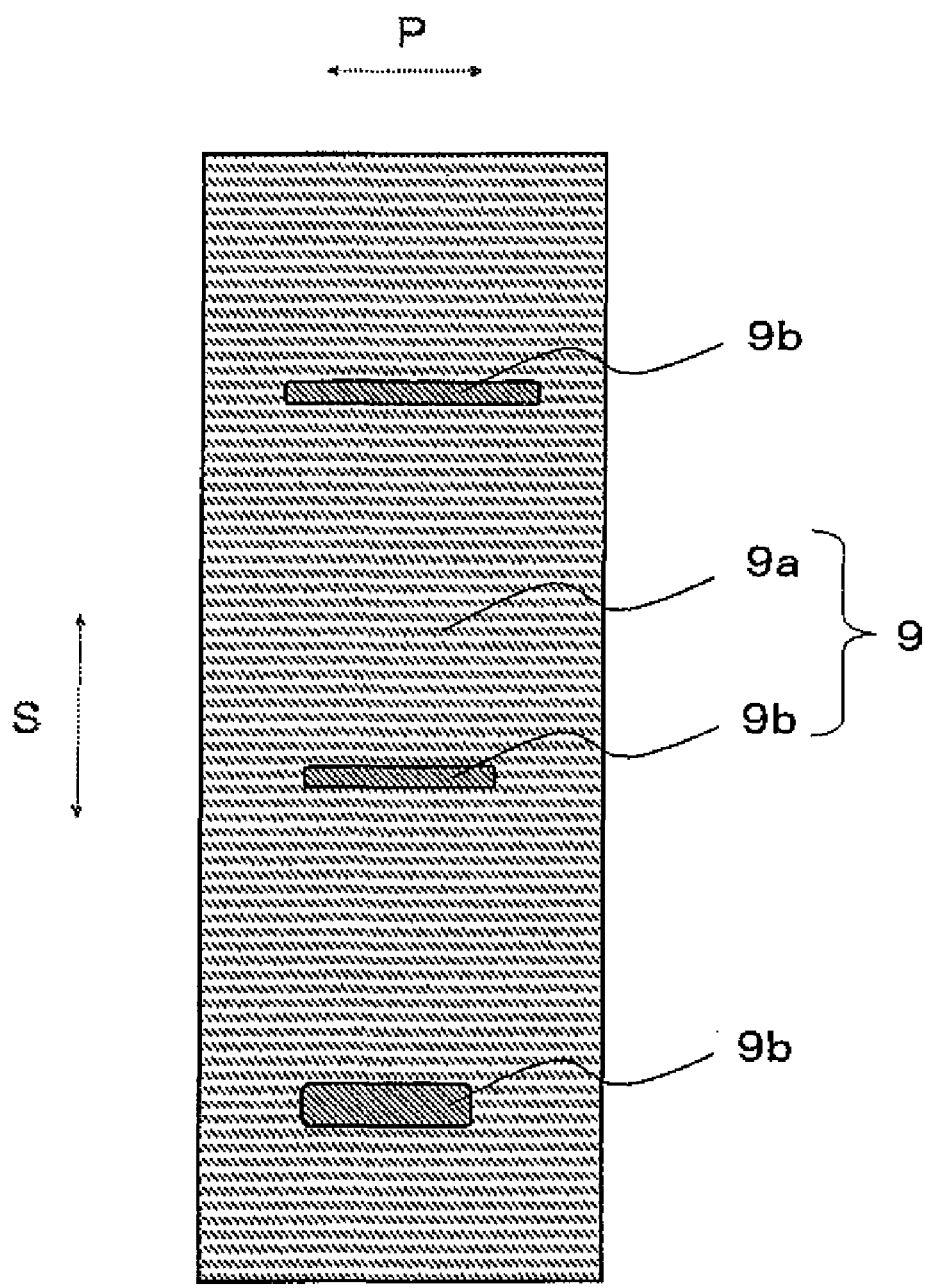
FIG. 4C is side view of a portion where the first protrusion is provided in the multi-layer piezoelectric element according to the fourth embodiment of the present invention.

Now fourth embodiment according to the present invention will be described. FIG. 4C is a side view of a portion where the first protrusion is provided in the multi-layer piezoelectric element according to the fourth embodiment.

It is more preferable that the first protrusion 9b is formed so as to be parallel to the stacking surface of the stacked body 7, in other words lengthwise direction of the first protrusion 9b is perpendicular to the stacked direction S, as shown in FIG. 4C. As a result, it is made possible to more effectively suppress such a shrinkage that causes warp in the direction P perpendicular to the stacked direction S with respect to the base portion 9a of the external electrode 9, because the first protrusion 9b having the configuration described above is provided.

It is also preferable that the first protrusion 9b is formed across one end to the other end of the external electrode 9 in the direction of width, as shown in FIG. 1. Peel-off can occur relatively easily at one end and the other end of the external electrode 9 in the direction of width, but presence of the first protrusion 9b in this portion reduces the possibility of peel-off from the stacked body 7 occurring at one end and the other end of the external electrode 9 in the direction of width.

As the first protrusion 9b is formed across one end to the other end of the external electrode 9 in the direction of width, it is made possible to decrease the deviation of warp in the direction of width. This enables it to suppress the stress from concentrating in part of the external electrode 9. As a result, the possibility of peel-off of the external electrode 9 from the stacked body 7 can be further reduced.

Figure 5:
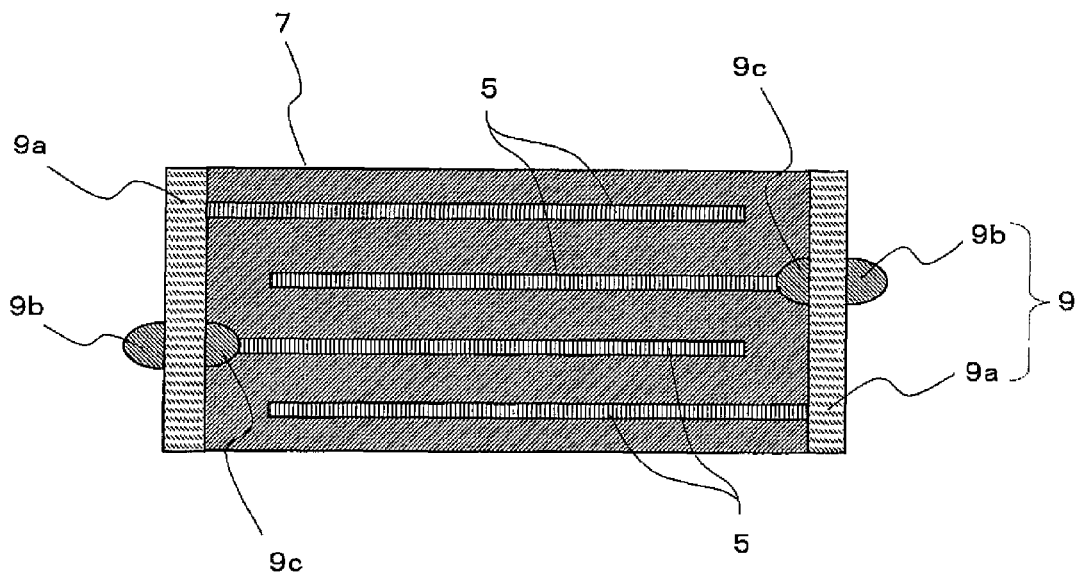
FIG. 5 is an enlarged sectional view of a portion where the first protrusion is provided in the multi-layer piezoelectric element according to the fifth embodiment of the present invention.

Now fifth embodiment according to the present invention will be described. FIG. 5 is an enlarged sectional view of a portion where the first protrusion is provided in the multi-layer piezoelectric element according to the fifth embodiment.

It is preferable that the first protrusion 9b is provided at a position to the side of the internal electrode 5 so as to face the end of one of the internal electrodes 5 as shown in FIG. 5. As the first protrusion 9b, that suppresses the base portion 9a from warping and improves the bonding between the external electrode 9 and the stacked body 7, is provided at a position to the side of the internal electrode 5, the bonding between the internal electrode 5 and the external electrode 9 can be improved. As a result, voltage can be applied stably via the external electrode 9 to the internal electrode 5, so that the amount of displacement is suppressed from decreasing even when the element 1 is used for a long period of time.

It is preferable that a plurality of first protrusions 9b are disposed side by side in the stacked direction S as in the first embodiment shown in FIG. 1. By providing the plurality of first protrusions 9b, it is made possible to respectively distribute the stress among the first protrusions 9b. Also as the plurality of first protrusions 9b are disposed side by side in the stacked direction S, warp can be suppressed over a wide area in the stacked direction S of the external electrode 9 for the following reason.

Specifically, in case the number of the first protrusion 9b is one, the external electrode 9 becomes more likely to warp as the distance from the first protrusion 9b increases. In case a plurality of the first protrusions 9b are provided in the stacked direction S, however, a portion interposed between two first protrusions 9b is suppressed by the first protrusions 9b from warping at both ends thereof in the stacked direction S, so that warping can be significantly decreased by this portion as a whole. That is, these two first protrusions 9b cooperatively suppress warping of the external electrode 9, instead of suppress warping of the external electrode 9 by working individually.

It is also preferable that the first protrusion 9b is provided for every set of such a number of internal electrodes 5 that is one half or less of the total number of internal electrodes 5 included in the stacked body 7, preferably for every set of one eighth or less of all internal electrodes 5, and more preferably for every set of one fifteenth or less of all internal electrodes 5. As the first protrusion 9b is provided for every set of half or less of all internal electrodes 5 included in the stacked body 7, the number of the first protrusions 9b increases and therefore it is made possible to decrease the variation in the bonding strength in the stacked direction S of the external electrode 9.

In this case, it is preferable that a plurality of the first protrusions 9b are disposed regularly, namely a plurality of the first protrusion 9b are disposed according to a certain rule. When a plurality of the first protrusions 9b are disposed regularly, it is made possible to decrease the variation in the stress generated in the bonding interface between the stacked body 7 and the external electrode 9, and suppress the stress from concentrating locally in a part of the bonding interface between the stacked body 7 and the external electrode 9. Thus since the variation in the stress generated inside of the stacked body 7 can be decreased, possibility of cracks occurring in the piezoelectric material layers 3 and in the internal electrodes 5 is decreased.

Herein, the phrase that a plurality of the first protrusions 9b are disposed regularly means not only a situation that the plurality of the first protrusions 9b are disposed at equal intervals, but also such a situation as the intervals between the first protrusions 9b are proximate to each other to such an extent that the external electrodes 9 can be uniformly and firmly bonded to the side face of the stacked body 7 in the stacked direction S. Specifically, it is preferable that variation in the intervals between the first protrusions 9b is within 20%, preferably 15% of the mean interval between the first protrusions 9b, and more preferably all intervals are the same. The first protrusions 9b are preferably disposed regularly in the central portion of the stacked body 7 in the stacked direction S that undergoes particularly large piezoelectric displacement. The intervals between the first protrusions 9b may also be intervals that sequentially decrease or increase toward the end.

It is preferable that the external electrode 9 has a second protrusion 9c that protrudes toward the inside at a position corresponding to the first protrusion 9b, as in the fifth embodiment shown in FIG. 5. Providing the second protrusion 9c makes it possible to form the external electrode 9 that has a thicker portion. As a result, the effect of the first protrusion 9b and the second protrusion 9c to function as splint is achieved. In case the second protrusion 9c is embedded in the stacked body 7, the second protrusion 9c serves as a wedge. Therefore, the bonding between the stacked body 7 and the external electrode 9 can be improved.

Figure 6:
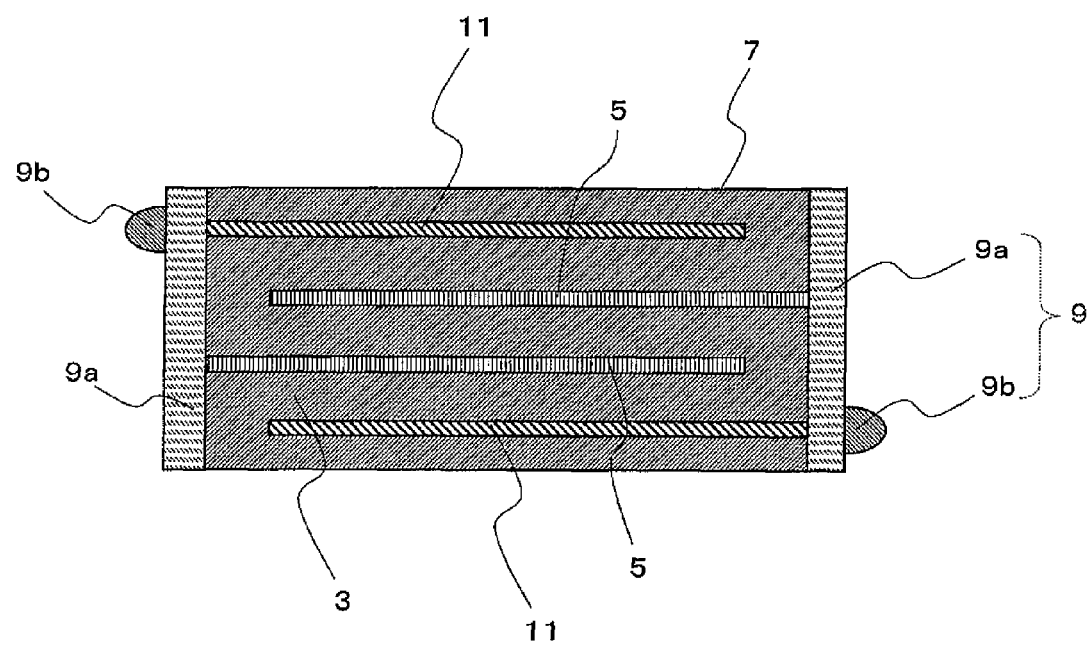
FIG. 6 is an enlarged sectional view of a portion where the first protrusion is provided in the multi-layer piezoelectric element according to the sixth embodiment of the present invention.

Now sixth embodiment of the present invention will be described. FIG. 6 is an enlarged sectional view of a portion where the first protrusion is provided in the multi-layer piezoelectric element according to the sixth embodiment.

It is preferable that the stacked body 7 has low-rigidity layer 11 having lower rigidity compared to those of the piezoelectric material layer 3 and the internal electrodes 5, as shown in FIG. 6. The low-rigidity layer 11 has rigidity lower than those of the piezoelectric material layer 3 and the internal electrodes 5. As a result, when stress is generated in the element 1, the low-rigidity layer 11 preferentially fractures. Since fracture of the low-rigidity layer 11 decreases the stress generated in the piezoelectric material layers 3 and in the internal electrodes 5, possibility of the piezoelectric material layers 3 and in the internal electrodes 5 to fracture can be decreased.

In the sixth embodiment, the low-rigidity layer 11 is a layer that has weaker bonding strength within the layer and/or between the adjacent layers compared to the piezoelectric material layer 3 and the internal electrode 5, and has lower rigidity. Specifically, the low-rigidity layer 11 may be formed from a material having lower rigidity compared with those of the piezoelectric material layer 3 and the internal electrodes 5, or a material that includes more voids than the piezoelectric material layer 3 and the internal electrodes 5 have, so as to lower the rigidity of the layer.

Comparison of rigidity among the low-rigidity layer 11, the piezoelectric material layer 3 and the internal electrode 5 can be easily done by, for example, applying a load to the element in a direction perpendicular to the stacked direction. Specifically, a load may be applied to the element in a direction perpendicular to the stacked direction according to the procedure of JIS three-point bending test (JIS R 1601). What is needed is simply locate the position where fracture occurs in the element 1 during the test, and the position of fracture is where rigidity is the lowest in the element.

Since the element of the sixth embodiment has the low-rigidity layer 11, when the element 1 is subjected to the JIS 3-point bending test, fracture is likely to occur within the low-rigidity layer 11 or in the interface between the low-rigidity layer 11 and the piezoelectric material layer 3, not in the piezoelectric material layer 3 and the internal electrodes 5. Thus presence of the low-rigidity layer 11 can be determined by checking to see whether fracture occurs in the piezoelectric material layer 3 or the internal electrodes 5, or within the low-rigidity layer 11 or in the interface between the low-rigidity layer 11 and the piezoelectric material layer 3.

In case the test piece is too small to be subjected to the JIS 3-point bending test, it may be tested as follows. A test piece is prepared by machining the element 1 into a rectangular prism shape in accordance to the above JIS 3-point bending test procedure. The test piece is placed on two supports disposed at a predetermined distance from each other, and a load is applied to the center between the supports. Thus presence of the low-rigidity layer 11 can be determined.

It is more preferable that the first protrusion 9b is provided at a position to the side of at least the low-rigidity layer 11 as shown in FIG. 6. Stress generated in the element 1 is relieved by causing the low-rigidity layer 11 to fracture, as described above. On the other hand, crack is more likely to occur in a portion positioned to the side of the low-rigidity layer 11 than other portions of the external electrode 9, due to the crack that has occurred in the low-rigidity layer 11. According to the present embodiment, possibility of the external electrode 9, particularly of the base portion 9a, to fracture due to the growth of crack can be decreased because the first protrusion 9b having larger thickness is positioned to the side of at least the low-rigidity layer 11.

Figure 7A:
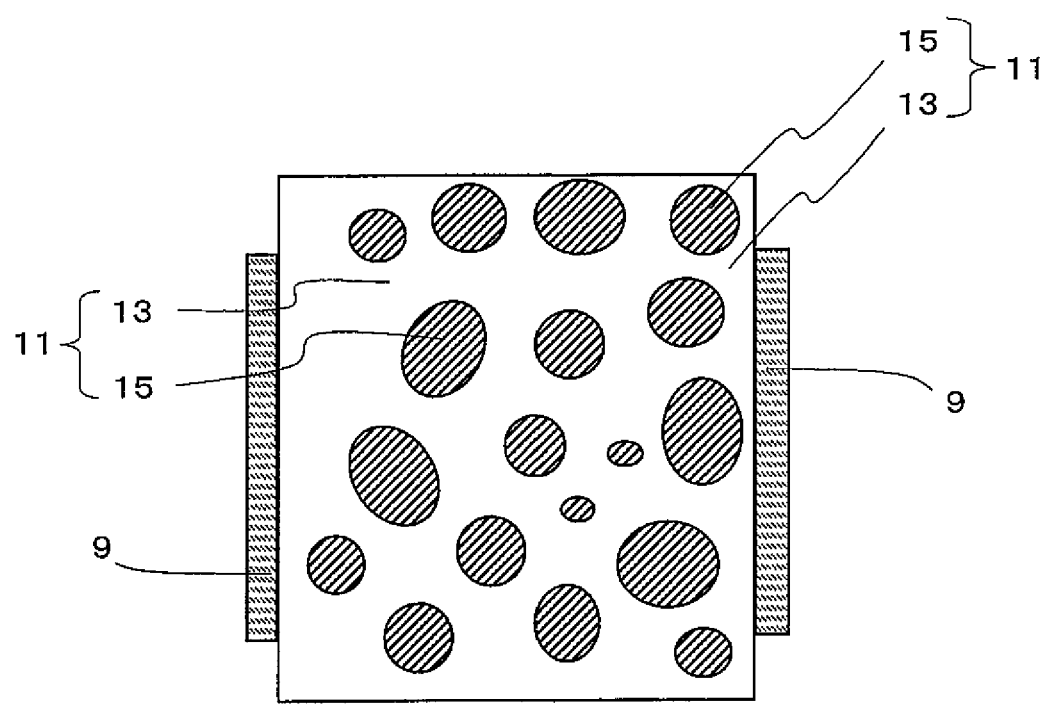
FIG. 7A is a sectional view, including low-rigidity layer, along direction perpendicular to the stacked direction of the multi-layer piezoelectric element according to the seventh embodiment of the present invention.

Now seventh embodiment of the present invention will be described. FIG. 7A is a sectional view of the multi-layer piezoelectric element according to the seventh embodiment in a section that is perpendicular to the stacked direction S and includes low-rigidity layer.

It is preferable that the low-rigidity layer 11 has a plurality of metal portions 15 that are spaced apart from each other via a void 13, as shown in FIG. 7A. This is because a metal component can easily deform and therefore has the effect of relieving the stress. Also because it is a different kind of material from the piezoelectric grains that constitute the piezoelectric material layer 3 that adjoins in the stacked direction S, crack that may occur in the metal portion 15 can be restricted to within the metal portion 15 or to the surface of the metal portion 15. As a result, cracks can be suppressed from growing into the piezoelectric material layer 3.

Further, as plurality of metal portions 15 are separated from each other by the void 13, each of the metal portions 15 is more likely to deform. Presence of the void 13 in the low-rigidity layer 11 enables a part of the external electrode 9 to infiltrate into the void 13. As a result, the external electrodes 9 can be more firmly bonded to the side face of the stacked body 7 by the anchoring effect.

Figure 7B:
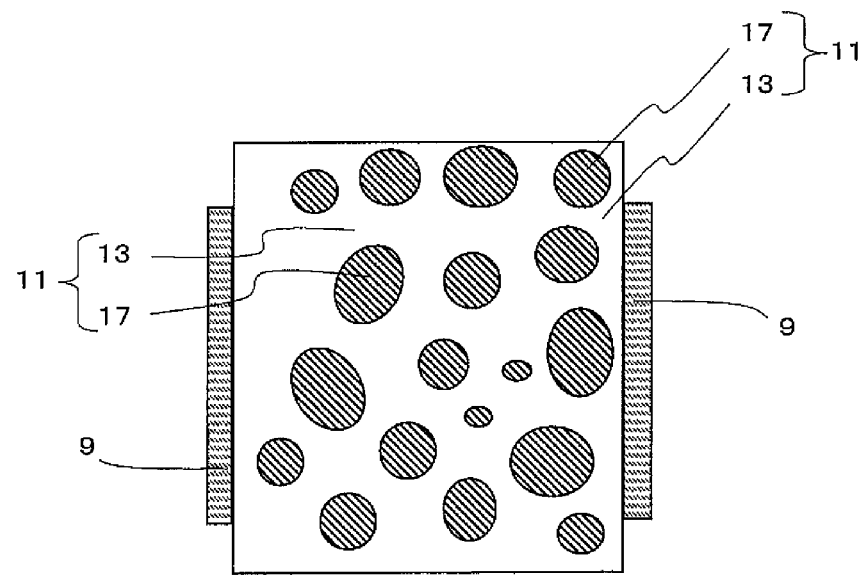
FIG. 7B is a sectional view, including low-rigidity layer, along direction perpendicular to the stacked direction of the multi-layer piezoelectric element according to the eighth embodiment of the present invention.

Now eighth embodiment of the present invention will be described. FIG. 7B is a sectional view of the multi-layer piezoelectric element according to the eighth embodiment in a section that is perpendicular to the stacked direction S and includes low-rigidity layer.

It is advantageous that the low-rigidity layer 11 has a plurality of ceramic portions 17 that are separated from each other by the void 13, as shown in FIG. 7B. As a plurality of ceramic portions 17 are separated from each other by the void 13, the individual ceramic portions 17 are more likely to deform. As a result, rigidity can be decreased, so that stress generated in the piezoelectric material layer 3 and in the internal electrodes 5 can be decreased.

Even when a crack grows from the low-rigidity layer 11 into the internal electrode 5 that adjoins in the stacked direction S, possibility of short-circuiting can be decreased since the low-rigidity layer 11 is constituted from the ceramic portions 17 of insulating material.

It is more preferable that the ceramic portions 17 are formed from the same component as that of the piezoelectric material layer 3. This constitution improves the bonding between the low-rigidity layer 11 and the piezoelectric material layer 3, and therefore it is made easier to maintain the profile of the element 1.

Figure 8:
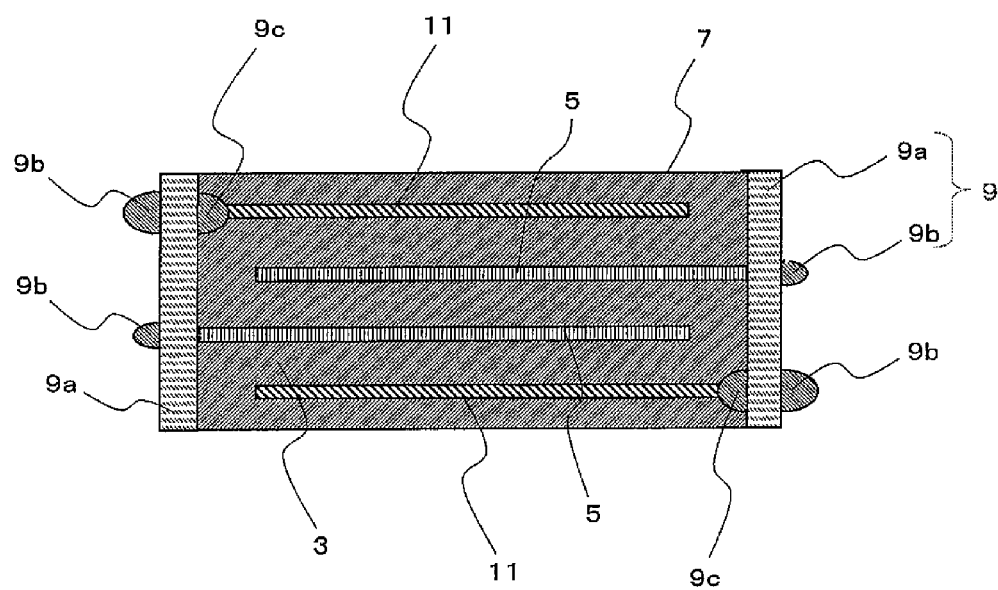
FIG. 8 is an enlarged sectional view of a portion where the first protrusion is provided in the multi-layer piezoelectric element according to the ninth embodiment of the present invention.

Now ninth embodiment of the present invention will be described. FIG. 8 is an enlarged sectional view of a portion where the first protrusion is provided in the multi-layer piezoelectric element according to the ninth embodiment.

It is preferable that a plurality of the first protrusions 9b are provided at position to the side of each of the internal electrode 5 and the low-rigidity layer 11, and height of the first protrusions 9b provided at a position to the side of the low-rigidity layer 11 is larger than the height of the first protrusions 9b provided at a position to the side of the internal electrode 5, as shown in FIG. 8.

As already described previously, a portion positioned to the side of the first protrusion 9b has high bonding property since it is suppressed from warping by the first protrusion 9b. On the other hand, it is also necessary to improve the bonding between the internal electrode 5 and the base portion 9a, in order to supply electric power to the internal electrode 5. In the present embodiment, crack is caused to occur in the low-rigidity layer 11. Stress tends to concentrate in the portion where high bonding is achieved between the stacked body 7 and the external electrode 9. Therefore, providing the first protrusion 9b of the configuration described above makes it possible to improve bonding between the internal electrodes 5 and the external electrodes 9, while mitigating the stress by means of the low-rigidity layer 11. In this case, it is preferable that the second protrusion 9c is provided to protrude toward the inside at a position corresponding to the first protrusion 9b, similarly to the fifth embodiment.

Now a method for manufacturing the multi-layer piezoelectric element 1 according to the present embodiment will be described.

First, ceramic green sheets that would become the piezoelectric material layers 3 are formed. Specifically, a calcined powder of a piezoelectric ceramic material, a binder made of an organic polymer such as an acrylic or a butyral resin and a plasticizer are mixed to form a slurry. The slurry is formed into sheets by a known method such as a doctor blade or calender roll method, or other tape molding method. The piezoelectric ceramic material is required only to have piezoelectric characteristics, and perovskite type oxide such as $PbZrO_3$—$PbTiO_3$ may be used. For the plasticizer, dibutyl phthalate (DBP) or dioctyl phthalate (DOP) or the like may be used.

Then an electrically conductive paste used to form the internal electrode 5 is prepared. Specifically, a metal powder such as silver-palladium alloy is mixed with a binder and a plasticizer to prepare the electrically conductive paste. The electrically conductive paste is applied to the ceramic green sheets by a screen printing process, and is fired to form the piezoelectric material layer 3 and the internal electrode 5 as will be described later.

The low-rigidity layer 11 can be formed by using a slurry with more binder added than in the electrically conductive slurry used to form the internal electrode 5, a slurry with more binder added than in the slurry used to form the piezoelectric material layer 3, or a slurry prepared by mixing acrylic beads with the electrically conductive slurry used to form the internal electrode 5 or the slurry used to form the piezoelectric material layer 3.

As the slurry that would form the low-rigidity layer 11 is applied to the ceramic green sheet by a screen printing process, the evaporative component such as the binder and the acrylic beads evaporate in the processes of firing and degreas-ing, so that the metal portions 15 or the ceramic portions 17 that are separated from each other by the void 13 are formed.

The method for forming the low-rigidity layer 11 is not limited to that described above. For example, the low-rigidity layer 11 having such a configuration as described above can be formed by changing the mesh size of the screen or the pattern configuration.

The low-rigidity layer 11 described above can also be formed by masking the screen so as to decrease the amount of the electrically conductive paste that passes the screen. The masking configuration is preferably near round shape such as oval or circle, which has the effect of mitigating the stress.

Then the external electrodes 9 are formed so as to establish electrical connection with the piezoelectric material layers 3 of which end portions are exposed on the outer surfaces of the multi-layer piezoelectric element 1. The external electrodes 9 can be formed by adding a binder to a silver powder and a glass powder to prepare a silver-glass paste, printing this paste and carrying out dry-bonding or baking process.

The first protrusion 9b can be formed by applying silver-glass electrically conductive paste by screen printing to a portion where the base portion 9a is to be formed, then applying the silver-glass electrically conductive paste again by screen printing to a portion where the first protrusion 9b is to be formed. That is, a screen which is masked over portions other than the first protrusion 9b may be used in one method of forming the first protrusion 9b.

The second protrusion 9c can be formed by forming a groove by using a dicing machine or the like at a position of the outer surface of the multi-layer piezoelectric element 1 where the second protrusion 9c is to be formed, and applying the silver-glass electrically conductive paste thereon by screen printing, so as to place the silver-glass electrically conductive paste therein.

In case such a low-rigidity layer 11 that has the metal portions 15 or the ceramic portions 17 which are separated from each other by the void 13 is provided, part of the silver-glass electrically conductive paste fills a part of the void 13 due to capillary effect, so that second protrusion 9c can be formed. At this time, the temperature at which the silver-glass electrically conductive paste is baked is preferably not lower than the softening point of the glass component included in the silver-glass electrically conductive paste, so as to make it easier to fill the void 13 with the silver-glass electrically conductive paste.

Then the stacked body 7 whereon the external electrodes 9 are formed is dipped in a resin solution that contains a silicone rubber. The silicone resin solution is deaerated in vacuum thereby having the external surface of the stacked body 7 covered by the silicone resin. The stacked body 7 is then pulled up from the silicone resin solution, with the side faces of the stacked body 7 coated with the silicone resin. Then lead wires are connected as power feeders by means of an electrically conductive adhesive or the like onto the external electrodes 9.

Then DC voltage is applied in a range from 0.1 to 3 kV/mm across a pair of external electrodes 9 so as to carry out polarization treatment of the stacked body 7, thereby to complete the multi-layer piezoelectric element 1 of the present embodiment. When the lead wires are provided to connect the external electrodes 9 and an external power supply and a voltage is applied to the piezoelectric material layers 3, the piezoelectric material layers 3 can undergo a large displacement by the reverse piezoelectric effect. Accordingly, the element is capable of functioning as an automobile fuel injection valve that supplies fuel to an engine.

Figure 9:
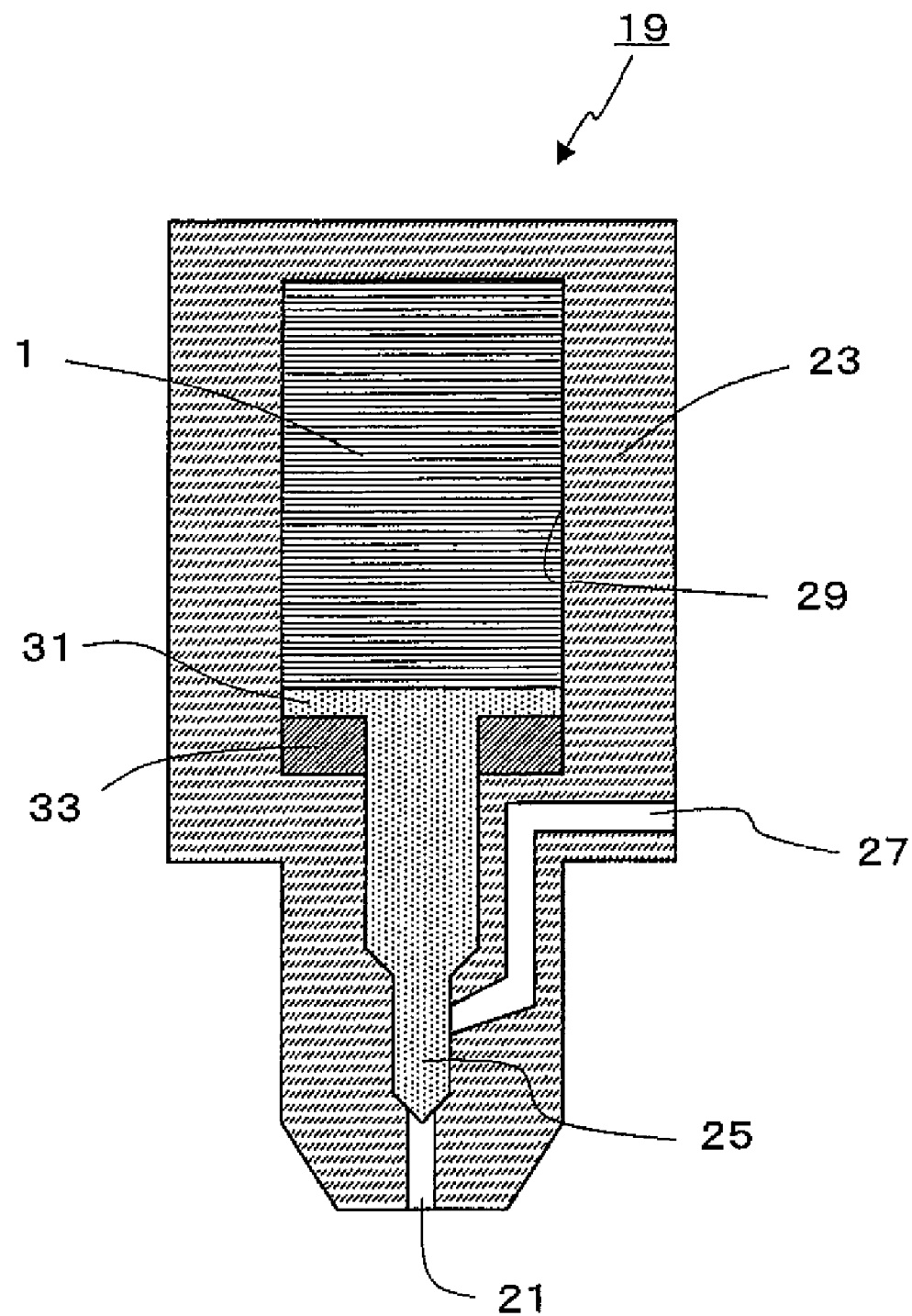
FIG. 9 is a schematic sectional view showing an injection apparatus according to one embodiment of the present invention.

Now an injection apparatus according to one embodiment of the present invention will be described. FIG. 9 is a schematic sectional view of the injection apparatus according to one embodiment of the present invention.

As shown in FIG. 9, the injection apparatus 19 of the present embodiment has the element 1 represented by the embodiment described above accommodated in a container 23 that has an injection orifice 21 formed at one end thereof.

The container 23 includes a needle valve 25 that can open or close the injection orifice 21 disposed therein. Connected to the injection orifice 21 is a fluid passage 27 that is capable of communicating therewith in response to the action of the needle valve 25. The fluid passage 27 is connected to a fluid source provided outside, so that a fluid is supplied through the fluid passage 27 at a constant pressure that is always high. Therefore, when the needle valve 25 opens the injection orifice 21, the fluid supplied to the fluid passage 27 is injected at a high constant pressure into a vessel disposed outside or side by side, for example a fuel chamber (not shown) of an internal combustion engine.

The needle valve 25 has larger diameter at the top end thereof, and a piston 31 is disposed so as to be capable of sliding in a cylinder 29 that is formed in the container 23. The element 1 described above is accommodated in the container 23.

With the injection apparatus 19 as described above, when the element 1 is caused to expand by applying a voltage thereto, the piston 31 is pressed so that the needle valve 25 plugs the injection orifice 21 and shuts off the supply of fluid. When the voltage is removed, the element 1 contracts and a Belleville spring 33 presses back the piston 31 so that the injection orifice 21 communicates with the fluid passage 27 thereby allowing the fluid to be ejected.

Such a constitution may also be employed as the fluid passage 33 is opened by applying a voltage to the element 1, and the fluid passage 33 is closed by removing the voltage.

The injection apparatus 19 of the present invention may also be constituted from the container that has the injection orifice 21 and the element 1, so that the liquid that fills the container is discharged through the injection orifice 21 by the operation of the element 1. That is, the multi-layer piezoelectric element 1 may not necessarily be in the inside of the container. The only requirement is that pressure can be applied to the inside of the container by the operation of the multi-layer piezoelectric element 1. In the present invention, the fluid may be a fuel, ink or various other fluids (such as electrically conductive paste) or gas. Use of the injection apparatus 19 makes it possible to control the flow rate of the fluid and the timing of ejection.

When the injection apparatus 19 comprising the element 1 of the present embodiment is used in an internal combustion engine, it is made possible to inject the fuel into the fuel chamber of an internal combustion engine more precisely over a longer period of time than in the case of the injection apparatus 19 of the prior art.

Figure 10:
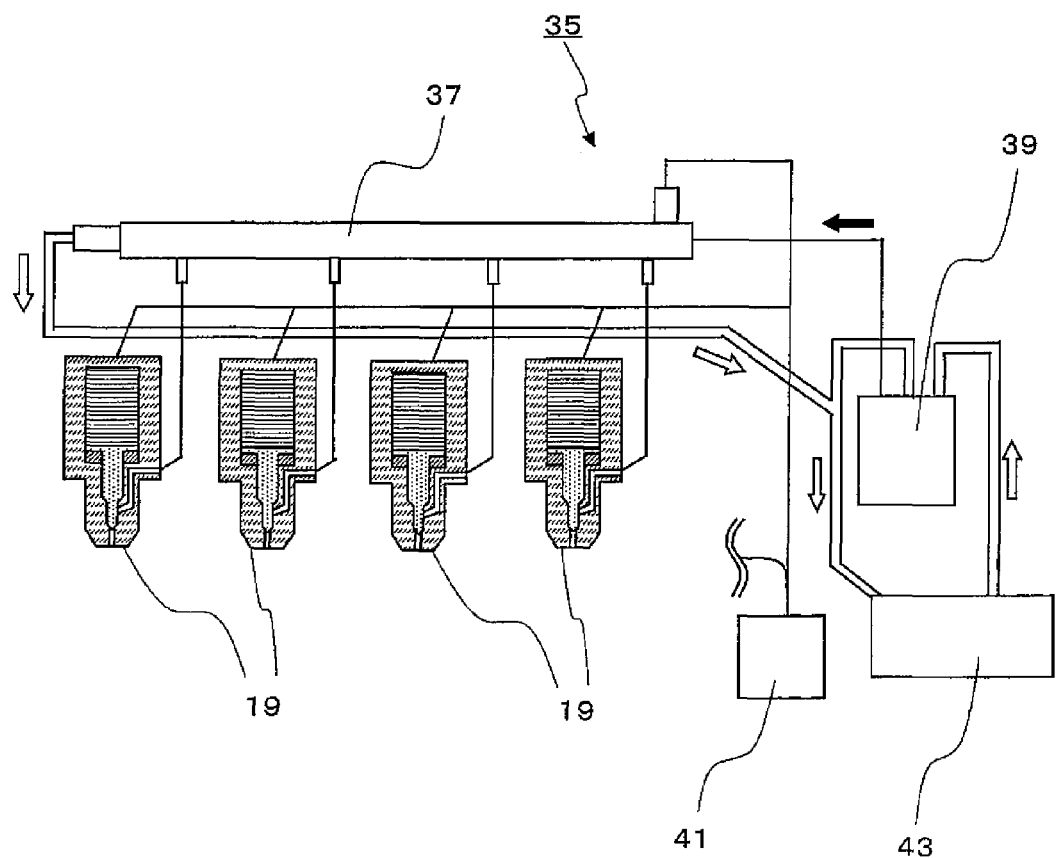
FIG. 10 is a schematic block diagram showing a fuel injection system according to one embodiment of the present invention.

Now a fuel injection system according to one embodiment of the present invention will be described. FIG. 10 is a schematic diagram showing the fuel injection system according to one embodiment of the present invention.

As shown in FIG. 10, the fuel injection system 35 of the present embodiment comprises a common rail 37 that stores a high-pressure fuel, a plurality of the injection apparatuses 19 that eject the fuel stored in the common rail 37, a pump 39 that supplies the fuel at a high pressure to the common rail 37 and an injection control unit 41 that sends a drive signal to the injection apparatuses 19.

The injection control unit 41 controls the quantity and timing of fuel injection in accordance to external information or a signal sent from the outside. In case the injection control unit is used in fuel injection for an engine, for example, the quantity and timing of fuel injection can be controlled by monitoring the conditions in the combustion chamber of the engine with sensors and the like. The pump 39 delivers the fluid fuel at a high pressure from the fuel tank 43 to the common rail 37. In the case of the fuel injection system for an engine, the fuel is supplied to the common rail 37 by boosting the pressure to a level in a range roughly from 1,000 to 2,000 atm (from about 101 MPa to about 203 MPa), preferably from 1,500 to 1,700 atm (from about 152 MPa to about 172 MPa). The common rail 37 stores the fuel supplied from the pump 39, and sends it to the injection apparatuses 19 as required. As described above, the injection apparatus 19 injects a predetermined amount of the fuel through the injection orifice 21 to the outside or the adjoining vessel. In the case of an engine, for example, the fuel is injected in the form of mist into the combustion chamber.

The present invention is not limited to the embodiment described above, and various modifications may be made within the scope of the present invention.

EXAMPLES

A piezoelectric actuator having the multi-layer piezoelectric element 1 was fabricated as described below. First, a calcined powder of piezoelectric ceramics constituted from lead titanate zirconate ($PbZrO_3$—$PbTiO_3$) having a mean particle size of 0.4 µm as the main component, a binder and a plasticizer were mixed to form a slurry. The slurry was formed into ceramic green sheets that would become the piezoelectric material layers 3 having thickness of about 150 µm by the doctor blade process.

Then an electrically conductive paste A that would form the internal electrodes 5 was prepared by adding a binder to silver-palladium alloy. Further, acrylic beads having a mean particle size of 0.5 µm were added to the electrically conductive paste A in proportion of 200% by volume relative to 100% by volume of the silver-palladium alloy, thereby preparing an electrically conductive paste B that would form the low-rigidity layer 11 which has the metal portions 15 that are separated from each other by the void 13.

The ceramic green sheets described above were coated on one side thereof with the electrically conductive paste A or the electrically conductive paste B by a screen printing process. 300 sheets having the electrically conductive paste A or B printed thereon were stacked one on another. The stack was fired at a temperature from 980 to 1,100° C. so as to obtain the stacked body 7.

In specimens No. 1 and No. 2, the electrically conductive paste A was printed with a thickness of 4 µm by screen printing to one side of the ceramic green sheet. 300 ceramic green sheets having the electrically conductive paste A printed thereon were stacked. The stack was fired at a temperature from 980 to 1,100° C. so as to obtain the stacked body 7.

In specimen No. 3, the electrically conductive paste A or the electrically conductive paste B was printed with a thickness of 4 µm by screen printing to one side of the ceramic green sheet. 300 ceramic green sheets having the electrically conductive paste A or B printed thereon were stacked so that a ceramic green sheet having the electrically conductive paste B printed thereon was provided for every 20 ceramic green sheets having the electrically conductive paste A printed thereon. The stack was fired at a temperature from 980 to 1,100° C. so as to obtain the stacked body 7.

Then a silver-glass paste that would form the external electrode 9 was prepared by adding a binder to a mixture of silver powder having a mean particle size of 2 μm and a glass powder having a softening point of 650° C. consisting of silicon having a mean particle size of 2 μm as the main component. The silver-glass paste was applied to the side face of the stacked body 7 with a thickness of 30 μm by a screen printing process.

In specimens No. 2 and No. 3, the silver-glass paste was printed again in an area where the first protrusion 9b is to be formed, so as to form the first protrusion 9b having thickness of 7 μm. The external electrode 9 was formed by baking at 700° C. for 30 minutes.

In specimen No. 3, since the low-rigidity layer 11 having the void 13 was provided, the second protrusion 9c was formed protruding toward the inside as the silver-glass paste was embedded at a position corresponding to the low-rigidity layer 11.

Then the lead wires were connected to the external electrodes 9, and DC electric field of 3 kV/mm was applied between the external electrodes 9 of positive and negative polarities via the lead wires so as to apply polarization treatment for 15 minutes, thereby to make the piezoelectric actuator using the multi-layer piezoelectric element 1. When a DC voltage of 160 V was applied to the piezoelectric actuator thus obtained, the piezoelectric actuator underwent displacement of 40 μm in the stacked direction S. The piezoelectric actuator was further subjected to continuous operation test of $1 \times 10^9$ cycles and $1 \times 10^{10}$ cycles by applying AC voltage in a range from 0 to +160 V with a frequency of 150 Hz at the room temperature. Test results are shown in Table 1.

TABLE 1

| Specimen No. | External electrode | Initial displacement | Displacement after $1 \times 10^9$ cycles of operation | Displacement after $1 \times 10^{10}$ cycles of operation |
|---|---|---|---|---|
| 1 | No protrusion | 40 μm | 30 μm | 10 μm |
| 2 | First protrusion formed | 40 μm | 40 μm | 35 μm |
| 3 | First and second protrusions formed | 40 μm | 40 μm | 40 μm |

In the piezoelectric actuator of specimen No. 1, the external electrode 9 had smooth outer surface without the first protrusion 9b. The amount of displacement decreased from 40 μm to 30 μm after $1 \times 10^9$ cycles of operation, as shown in Table 1.

This is because the first protrusion 9b was not formed on the external electrode 9 in the piezoelectric actuator of specimen No. 1, and part of the external electrode 9 peeled off the side face of the stacked body 7. As a result, electrical connection between part of the internal electrode 5 and the external electrode 9 was broken, thus resulting in a decrease in the amount of displacement as the voltage was not supplied to a part of the piezoelectric material layers 3.

In specimens No. 2 and No. 3, on the other hand, the external electrode 9 had the first end 9b. As a result, bonding strength between the stacked body 7 and the external electrode 9 was improved. After $1 \times 10^9$ cycles of operation, decrease in the amount of displacement was not observed, and the displacement of 40 μm similar to that achieved before the continuous operation test was maintained in both specimens.

After the test of $1 \times 10^{10}$ cycles of continuous operation, the amount of displacement decreased to 10 μm in specimen No. 1, and that of specimen No. 2 decreased to 35 μm. In specimen No. 3, in contrast, that had the first protrusion 9b and the second protrusion 9c, any decrease in the amount of displacement was not observed after the test of $1 \times 10^{10}$ cycles of continuous operation. Thus, it was found that specimen No. 3 had higher durability than that of specimen No. 2.

The invention claimed is:

1. A multi-layer piezoelectric element, comprising:
   a stacked body comprising a plurality of piezoelectric material layers and a plurality of internal electrodes, the stacked body being formed by stacking the plurality of internal electrodes and the piezoelectric layers alternately on each other; and
   an external electrode formed on a side face of the stacked body,
   wherein the external electrode comprises a base portion comprising silver and a first protrusion comprising silver protruding from the base portion toward an outside, the first protrusion monolithically integrated with the base portion.

2. The multi-layer piezoelectric element according to claim 1,
   wherein the first protrusion has a longitudinal length is shorter than a lateral length, the longitudinal length being defined as a distance between two lines drawn so as to be perpendicular to a stacked direction and tangential to a circumference of the first protrusion on a surface of the base portion, the lateral length being defined as a distance between two lines drawn so as to be parallel to the stacked direction and tangential to the circumference of the first protrusion on the surface of the base portion.

3. The multi-layer piezoelectric element according to claim 2,
   wherein a lengthwise direction of the first protrusion is perpendicular to the stacked direction.

4. The multi-layer piezoelectric element according to claim 1, wherein the first protrusion is configured to extend from one end to the other end of the base portion.

5. The multi-layer piezoelectric element according to claim 1, wherein the first protrusion is configured to face an end of one of the internal electrodes.

6. The multi-layer piezoelectric element according to claim 1, wherein the first protrusion in a plurality are disposed side by side in the stacked direction.

7. The multi-layer piezoelectric element according to claim 6, wherein the first protrusion in the plurality are disposed according to a predetermined rule.

8. The multi-layer piezoelectric element according to claim 1, wherein the external electrode comprises a second protrusion protruding toward an inside at a position corresponding to the first protrusion.

9. The multi-layer piezoelectric element according to claim 1, wherein the stacked body comprises a low-rigidity layer having a lower rigidity compared to those of the piezoelectric material layers and the internal electrodes, and wherein the first protrusion is at least lateral to the low-rigidity layer.

10. The multi-layer piezoelectric element according to claim 9, wherein the low-rigidity layer comprises a plurality of metal portions that are spaced apart from each other via a void.

11. The multi-layer piezoelectric element according to claim 9, wherein the first protrusion in the plurality are lateral to the internal electrodes and the low-rigidity layer, and a height of the first protrusion being lateral to the low-rigidity layer is higher than a height of the first protrusion being lateral to the internal electrodes.

12. An injection apparatus, comprising;
   the multi-layer piezoelectric element according to claim 1; and
   an injection orifice,
   wherein the injection orifice is configured to discharge a liquid by an operation of the multi-layer piezoelectric element.

13. A fuel injection system, comprising:
   a common rail configured to store a high-pressure fuel;
   the injection apparatus according to claim 12 configured to eject the high-pressure fuel stored in the common rail; and
   an injection control system configured to send a drive signal to the injection apparatus.

* * * * *